United States Patent [19]
Donaldson

[11] Patent Number: 5,399,908
[45] Date of Patent: Mar. 21, 1995

[54] APPARATUS AND METHOD FOR FORCED SHARING OF PARALLEL MOSFET SWITCHING LOSSES

[75] Inventor: Scott B. Donaldson, Blacksburg, Va.

[73] Assignee: Kollmorgen Corporation, Waltham, Mass.

[21] Appl. No.: 905,252

[22] Filed: Jun. 26, 1992

[51] Int. Cl.[6] ............................................. H02J 3/00
[52] U.S. Cl. ..................................... 307/58; 307/82
[58] Field of Search .................. 318/138, 254, 439; 307/43, 52, 53, 55, 58, 82

[56] References Cited

U.S. PATENT DOCUMENTS

| | | | |
|---|---|---|---|
| 4,811,184 | 3/1989 | Koninsky et al. | 363/17 |
| 4,890,210 | 12/1989 | Myers | 363/21 |
| 5,070,292 | 12/1991 | Goff | 318/811 |
| 5,081,409 | 1/1992 | Goff | 318/811 |
| 5,084,666 | 1/1992 | Bolash | 323/283 |
| 5,253,155 | 10/1993 | Yamamoto | 363/71 |

FOREIGN PATENT DOCUMENTS

| | | |
|---|---|---|
| 0096370 | 12/1983 | European Pat. Off. . |
| 0158425 | 10/1985 | European Pat. Off. . |
| 54-65351 | 5/1979 | Japan . |
| 55-136868 | 10/1980 | Japan . |
| 2082002 | 2/1982 | United Kingdom . |
| WO86/04164 | 12/1985 | WIPO . |

Primary Examiner—Jeffrey A. Gaffin
Attorney, Agent, or Firm—Morgan & Finnegan

[57] ABSTRACT

A system for sharing of switching losses of parallel transistors is disclosed. The system includes a plurality of switching transistors connected in parallel for providing a current to a load. A pulse generator provides pulse width modulated pulse cycles in response to the load current each pulse cycle having a pulse signal. An alternate selector is responsive to said pulse cycles, and provides the pulse cycles to the transistors, such that for each pulse cycle a predetermined transistor turns ON substantially prior to the other transistors, dissipating substantially all the turn ON losses, and a predetermined transistor turns OFF substantially later than other transistors, dissipating substantially all the turn OFF losses.

20 Claims, 4 Drawing Sheets

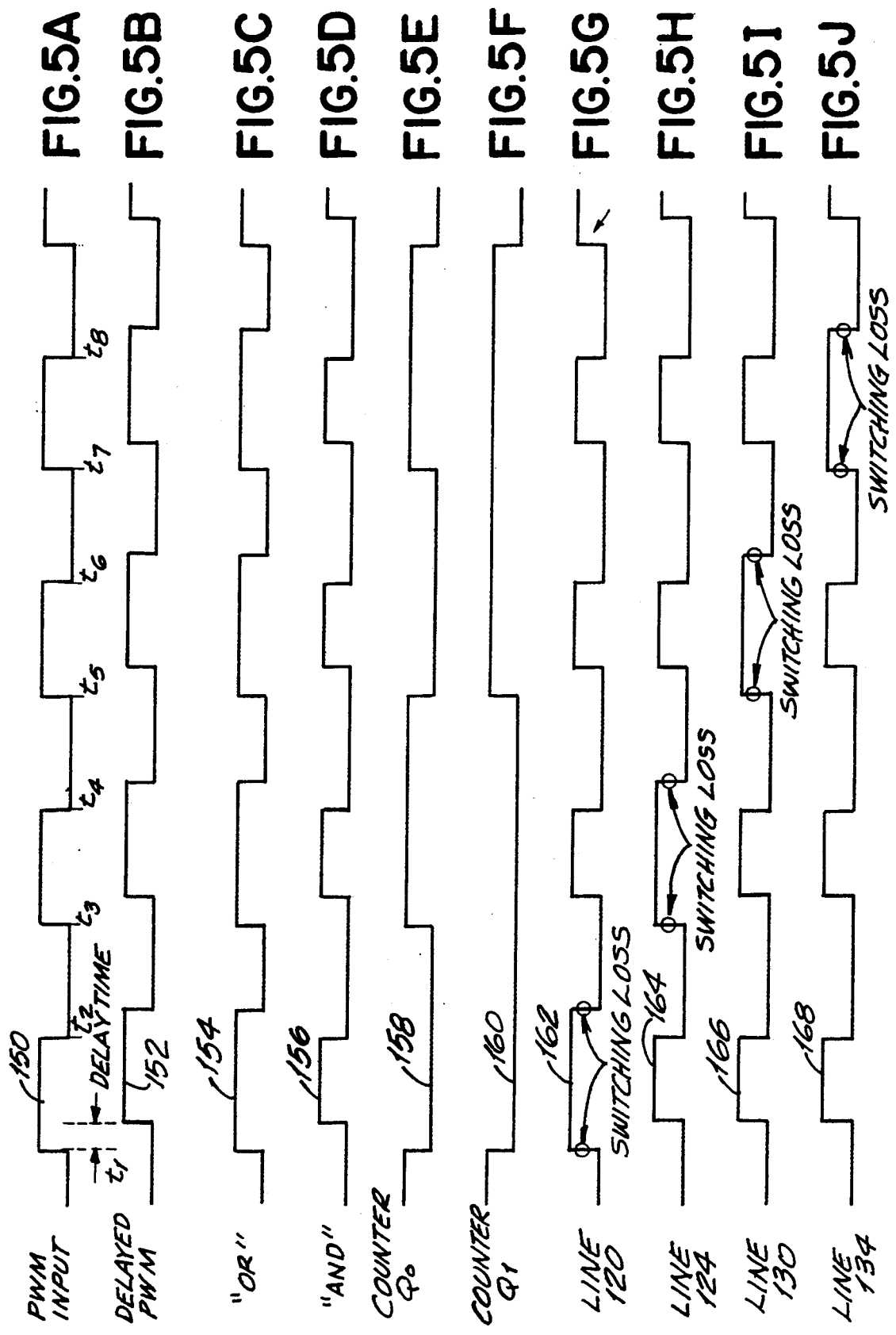

APPARATUS AND METHOD FOR FORCED SHARING OF PARALLEL MOSFET SWITCHING LOSSES

1. Field of the Invention

This invention relates to parallel switching MOSFETs and more specifically to a new system for forced sharing of switching losses when a plurality of switching MOSFETs are connected in parallel.

2. Background of the Invention

Power MOSFETs are becoming more and more popular in many applications due to their many advantageous features. Typically, MOSFETs have fast switching characteristics allowing high frequency operations. MOSFET devices also have a high gate input impedance, which allows for the design of a simple and efficient gate drive circuit.

Furthermore, the channel resistance of a power MOSFET has a positive temperature coefficient. Because of the positive temperature coefficient of the channel resistance, as the operating temperature rises, the channel resistance increases also, limiting the current flow. Therefore, many power MOSFET devices may be connected in parallel with much less design attention than with bipolar transistors.

Parallel MOSFETs may be used in switchmode applications, like switching power supplies and pulse width modulation control of both brush and brushless motors.

One major advantage of parallel MOSFET design concept is that many transistors connected in parallel can provide a much larger current to a load circuit during steady state conditions. Conversely, for the same current requirements, parallel MOSFET transistors dissipate less power than one transistor providing the same current.

This is apparent by measuring the power loss ($P_L$) using the formula $P_L = I^2 R$. Therefore if one transistor provides a desired current (I) to a load, two transistors each may provide currents I/2 to the load. The power loss ($P_L$) in the case of two parallel transistors becomes $I^2 \cdot R/2$ which is one half the power loss ($P_L$) in the case of one transistor.

A major design constraint when parallel MOSFETs are implemented is the fact that during the switching transition, the transistors may not share power losses equally. Therefore, depending on the electrical characteristics of each transistor, there could be situations where one transistor may turn ON before all the others connected in parallel with it and it may turn OFF after all the other transistors in parallel with it had already been turned OFF.

The unequal characteristics of switching transistors would cause the transistors with faster turn ON time or slower turn-OFF time conduct the entire load current during turn ON or turn-OFF at each switching cycle. Consequently, that transistor would operate under more strenuous conditions than the rest of the transistors and would fail to operate before the remaining transistors. Furthermore, the turn ON threshold of a MOSFET transistor is inversely proportional to the operating temperature. Therefore, as the operating temperature increases, the transistor turns ON earlier, leading to a runaway condition which may result in the transistor's early failure.

One solution to the problem of unequal sharing of losses during turn-ON and turn-OFF is to match the electrical characteristics of all transistors connected in parallel. Therefore, all transistors to be connected in parallel are first tested and those with matching characteristics are selected for the parallel design configuration.

In order to provide transistors with matching dynamic characteristics, the transistors are selected from the same die or are matched for both gate threshold voltage and transconductance. This matching can be costly for high production runs and very difficult for low production runs due to limited sample sizes.

Furthermore, even if matching transistors have been utilized for parallel design, it is possible for device characteristics to vary differently over time and temperature. Therefore, the circuit could end up with unequal transistor characteristics after a certain period of operation or under different loads or environmental conditions.

Hence there is a need for a practical design wherein MOSFET transistors are connected in parallel with capability to share switching losses equally.

SUMMARY OF THE INVENTION

Accordingly an object of the present invention is to provide equal sharing of switching losses when MOSFET transistors are connected in parallel.

A further object of the invention is to provide a system wherein each transistor in a group of MOSFET transistors connected in parallel is forced to turn ON ahead of the other transistor(s) for each cycle.

A still further object of the invention is to distribute stressful conditions equally in each transistor within a group of parallel MOSFET transistors without testing and matching the dynamic parameters of the transistors.

A still further object of the invention is to provide excitation signals to the stator of electric motors, specifically brushless DC motors with equal sharing of switching losses.

A still further object of the invention is to provide a switching power supply with equal sharing of switching losses when MOSFET transistors are connected in parallel.

According to the present invention, a group of MOSFET transistors operating in switching mode may be connected in parallel, providing a certain current to a load circuit. A timing circuit and a selector, command one of the transistors to turn ON ahead of the other parallel transistors dissipating the turn-ON losses by itself. After a delay time $\Delta t$ which is long enough for the switching transition to complete, the other parallel transistors are turned ON to reduce the total ON-resistance. Similarly during turn-OFF, the time delay circuit and the selector, command a single transistor to turn-OFF last and dissipate the turn-OFF losses by itself. The time delay and the selector rotate the forced turn-ON and turn-OFF sequence among all the parallel transistors. Thus, each transistor will dissipate all the switching losses during its early turn-ON and late turn-OFF cycles and none during the other cycles.

BRIEF DESCRIPTION OF THE DRAWINGS

FIGS. 5A–5J illustrate the timing diagram associated with the operation of the circuit shown in FIG. 4.

DETAILED DESCRIPTION OF THE DRAWINGS

Figure 1:
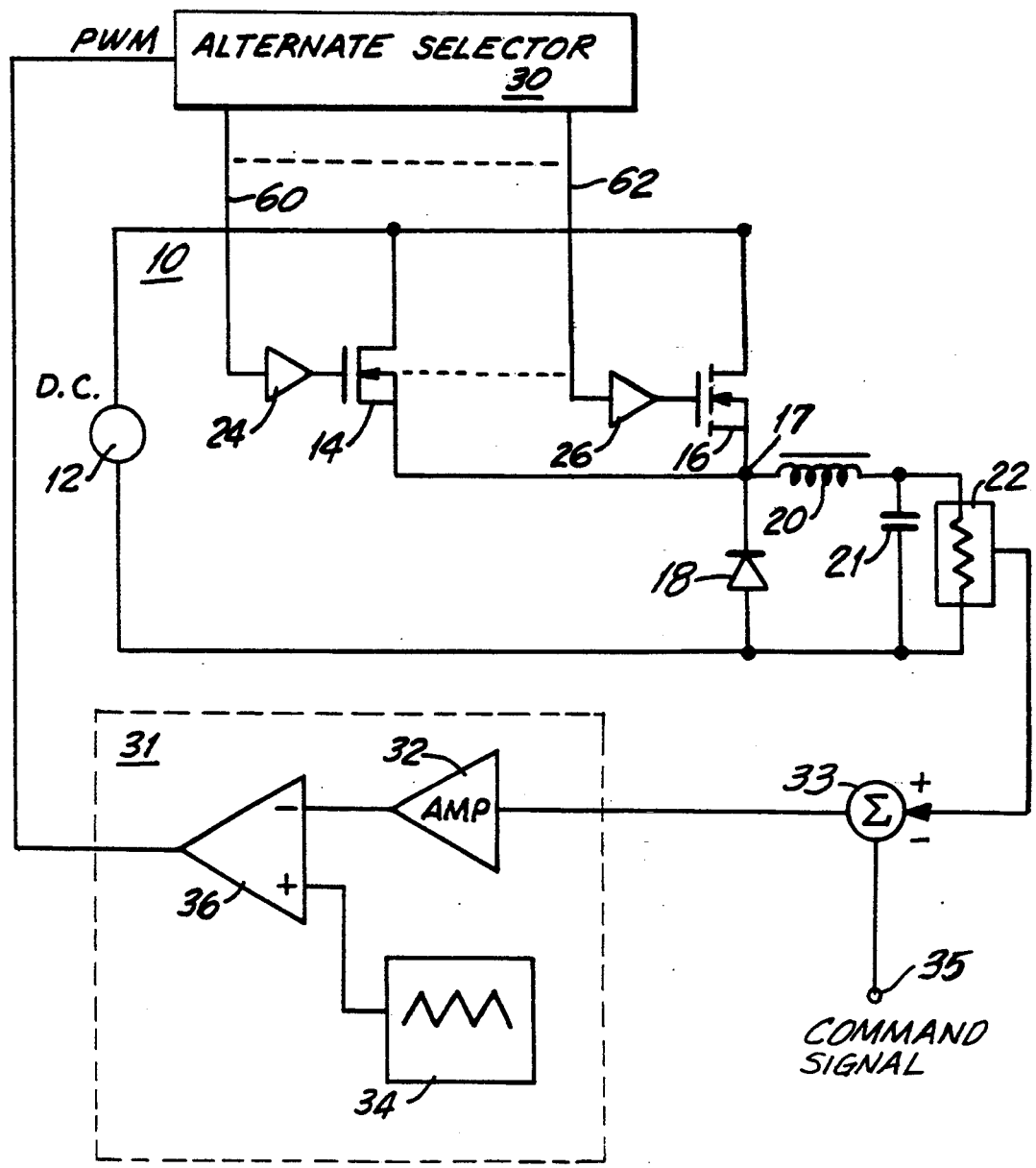
FIG. 1 illustrates a typical switchmode power circuit controlled by one embodiment of the present invention.

Accordingly, FIG. 1 illustrates a typical switch mode power circuit 10 using two parallel MOSFETS.

A positive terminal of D.C. supply 12 is connected to the drain terminals of MOSFET transistors 14 and 16. It can be appreciated to those skilled in the art that more than two MOSFET transistors may be connected in parallel. The source terminals of MOSFET transistors 14 and 16 are also connected together providing current to bus 17 when the MOSFET transistors are ON. The gate terminal of transistor 14 is coupled to the output of gate drive circuit 24. Similarly, the gate of transistor 16 is coupled to the output of gate drive 26. Gate drives 24 and 26 are typically buffer circuits with high input impedance and low output impedance.

A fly back diode 18 couples bus 17 to the negative terminal of D.C. supply 12. A low pass filter including inductor 20 and capacitor 21 is connected to bus 17 to provide a filter output to a load 22 via the first terminal of the load. The other terminal of load 22 is coupled to the anode of flyback diode 18. Therefore, current through bus 17 flows into load 22 after being smoothed by the filter.

In order to control the current in the load a feedback circuit 31 is provided.

Circuit 31 contains a signal amplifier 32 which is responsive to a signal provided by summing circuit 33. The summing circuit generates a difference between a signal representing the actual current in load 22 and command signal 35. Command signal 35 is the reference signal representing the desired amplitude of current in load 22. The output of the signal amplifier is provided to a comparator 36. The non-inverting input of the comparator is responsive to the output of the signal amplifier. A triangle wave generator 34 provides a modulation signal to the inverting input of the operational amplifier. Thus the output of operational amplifier 36 provides a pulse width modulated signal (PWM) whose duty cycle is dependent on the current amplitude provided in load 22 and command signal 35.

The PWM signal is coupled to an alternate selector 30. Alternate selector 30 has two outputs, each connected to the input of gate drive 24 and the input of gate drive 26 respectively. It can be appreciated that the alternate selector may have many outputs depending on the number of transistors connected in parallel.

During the operation of the switchmode power circuit, the current provided to load 22 may be regulated by implementing the circuit illustrated by FIG. 1. Accordingly, when switching transistors 14 and 16 are ON and are operating in their saturation region, they exhibit an ON-resistance. A current flow is then provided from the D.C. Supply source through the ON-resistance of transistor 14 and 16. The current signal is then filtered and is eventually provided to load 22.

Amplifier 32 provides an error signal representing the difference between the command signal 35 and the current in load 22. The error signal provided at the output of amplifier 32 is coupled to the comparator 36. Triangle wave generator 34 provides a modulation signal which is compared to the error signal provided at the output of amplifier 32. The output of the comparator provides a variable duty cycle pulse width modulated signal, depending upon the amplitude of the error signal.

The pulse width modulated signal is then coupled to the alternate selector 30. The pulse width modulated signal includes a plurality of cyclic pulse trains with a fixed pulse period. The pulse period is the time interval from the start of one pulse to the start of the next pulse. Each cycle has a pulse duration defined as "ON" period which is shorter or equal to the pulse period. The duty cycle is the ratio of the pulse duration over the pulse period and may be varied depending on the current provided in load 22.

Figure 3A:
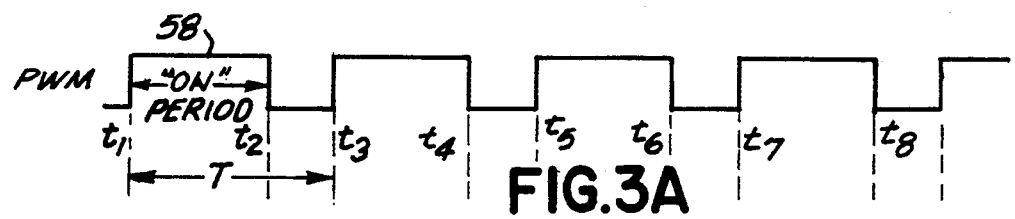
FIGS. 3A–3D illustrate the timing diagram associated with the operation of the circuits shown in FIG. 1 and 2.

FIG. 3A illustrates a PWM signal 58. The alternate selector 30 forces transistor 14 to turn ON first before transistor 16. Therefore, the output of the alternate selector on line 60 to which gate drive 24 is responsive, rises to HIGH level simultaneously with the start of a pulse provided to the alternate selector. After a period of time $\Delta t$, the second output (line 62) of the alternate selector 30 also rises to HIGH level and hence transistor 16 is turned ON also. Since transistor 14 had been already turned ON before transistor 16, there will be no switching losses when transistor 16 is turned ON. When the pulse provided to alternate selector goes LOW, alternate selector 30 provides a LOW signal on line 62 to the output that is coupled to transistor 16. Therefore transistor 16 turns OFF simultaneously as the PWM pulse shifts to LOW level. After a period of time $\Delta t$, the output of the alternate selector to which gate of transistor 14 is responsive also goes to the LOW level. Therefore transistor 14 turns OFF after transistor 16. Again, since transistor 14 was ON when transistor 16 turned OFF, there is no switching losses during transistor 16 turn-OFF. Hence, all the switching losses at turn-ON and turn-OFF are dissipated by transistor 14 for one cycle.

During the next cycle the above described procedure is switched such that transistor 16 is first turned-ON before transistor 14. A time delay $\Delta t$ later, transistor 14 is turned ON during which effective current sharing is provided by both transistors. Thereafter when the PWM pulse goes to LOW level, transistor 14 is turned OFF a time $\Delta T$ earlier than transistor 16. Since transistor 14 is turned ON after transistor 16 and turned OFF before transistor 16, it does not exhibit switching losses. Hence during this cycle, only transistor 16 dissipates all the switching losses.

It can be appreciated that for each pulse cycle, regardless of transistor characteristics, each transistor sustains the entire load current and switching losses during the delay time $\Delta t$. Delay time $\Delta T$ is preferably long enough so that the switching transition may be completed in each transistor. A typical delay may be around 200 nano-seconds.

Figure 2:
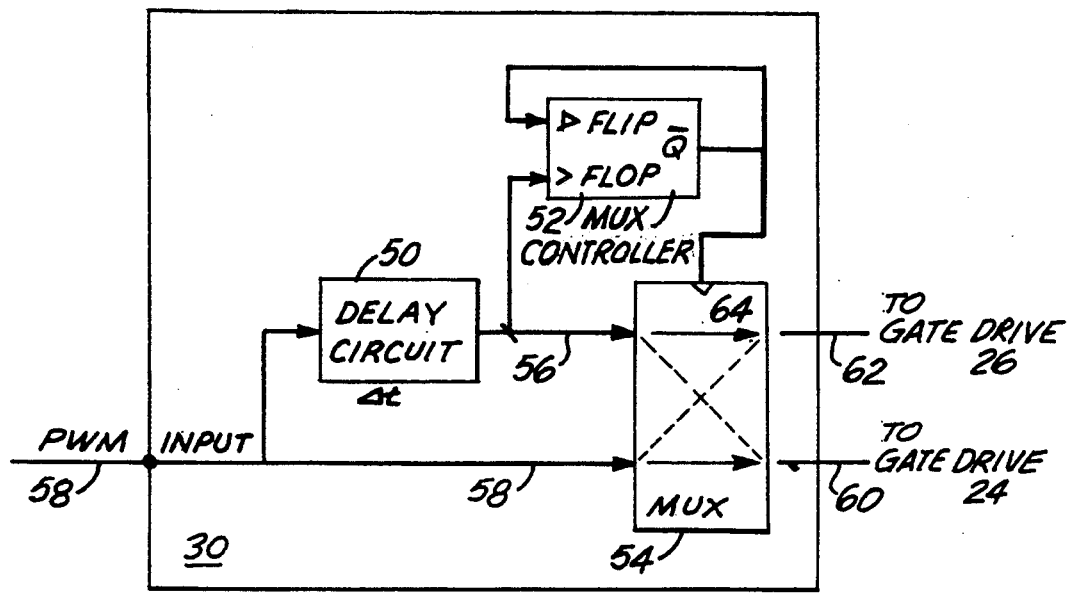
FIG. 2 illustrates a block diagram of alternate selector according to one embodiment of the present invention.

FIG. 2 illustrates a block diagram of alternate selector 30 according to one embodiment of the present invention. FIGS. 3A–3D illustrate the timing diagram associated with the operation of the circuit shown in FIG. 2.

The PWM pulse train 58 is coupled to the input of the alternate selector. The alternate selector according to one embodiment of the invention includes a delay circuit 50, a multiplex controller which according to this embodiment is a flip-flop 52 and a multiplexer 54. The input of the delay circuit receives the PWM pulse train. The output of the delay circuit is connected to the clock input of the flip-flop. The inverted output of the flip-flop is connected to the D input. The output of the flip-flop is also connected to the S input which is the multiplexer Select port 64.

Multiplexer 54 has two inputs, one of which is connected to the output of delay circuit 50 to receive signal 56 which is the delay version of PWM pulse 58, and the other is connected to the input port of alternate selector 30 to receive the PWM pulses 58. The outputs of multiplexer 54 provide signals via lines 60 and 62 to gate drives 24 and 26 of FIG. 1.

Figure 3B:
Figure 3C:
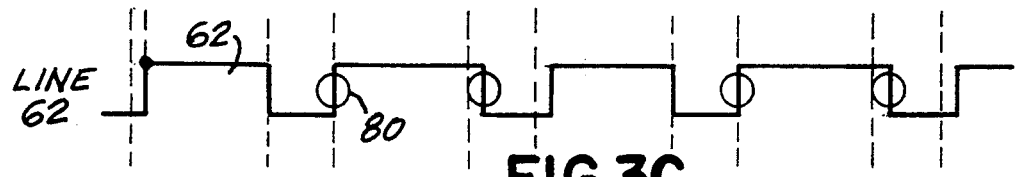

The wave forms illustrated in FIGS. 3A–3D explain the operation of the alternate selector. Accordingly the pulse width modulated signal 58 as shown in FIG. 3A is provided from the output amplifier 36 of FIG. 1 to the input of the alternate selector. At time $t_1$ a new cycle begins at the start of a pulse. During this time, multiplexer 54 couples signal 58 to gate drive 24 via line 60, and therefore transistor 14 turns ON. The delay circuit 50 which is also responsive to the input pulse signal 58, provides a delayed pulse which starts at $t_1 + \Delta t$. Flip-flop 52 is adapted to change its state at the rising edge of a pulse provided to its clock input. Therefore at time $t_1 + \Delta t$ the flip-flop changes its state. Multiplexer Select port 64 senses the change of state of flip-flop 52 and switches the multiplexer inputs, such that signal 56 from delay circuit 50 is coupled to gate drive 24 via line 60 and signal 58 from the input is coupled to gate drive 26 via line 62. At this time the signal at line 62 starts its ON period also as illustrated by FIG. 3C, and transistor 16 turns ON, $\Delta t$ seconds after transistor 14.

At time $t_2$ the ON period of pulse signal 58 falls to LOW state. Since signal 58 is now coupled to gate drive 26, the signal in line 62 also goes to LOW state at time $t_2$ and therefore transistor 16 turns OFF. After $\Delta T$ seconds, signal 56 from the delay circuit also goes to the LOW state. Therefore the signal in line 60 goes to LOW state at time $t_2 + \Delta t$ as illustrated in FIG. 3B. Therefore transistor 14 turns OFF $\Delta t$ seconds after transistor 16. As illustrated and explained above, for one cycle of pulse width modulated signal 58, transistor 14 turns ON $\Delta t$ seconds prior to transistor 16 and turns OFF $\Delta t$ seconds later than transistor 16.

At time $t_3$ a new cycle begins at the start of a pulse. Multiplexer 54 is still coupling signal 56 to line 60 and signal 58 to line 62. Therefore at the rise of the pulse at time $t_3$, gate drive 26 also senses a rise and begins to turn ON transistor 16. The delay circuit 50 which is also responsive to the input pulse, provides a delayed pulse which starts at time $t_3 + \Delta t$. Hence at time $t_3 + \Delta t$ flip-flop 52 senses a rising edge and changes its state. Multiplexer 54 through multiplexer control port 64 receives the signal from the flip-flop and switches the multiplexer inputs, such that signal 56 from delay circuit 50 is coupled to gate 26 via line 62 and signal 58 from the input is coupled to gate drive 24 via line 60. At this time, the signal at line 60 starts its ON period also as illustrated by FIG. 3B, and transistor 14 turns ON, $\Delta t$ seconds after transistor 16.

At time $t_4$ the ON period of pulse signal 58 falls to LOW state. Signal 58 is now coupled to line 60 and therefore gate drive 24. The signal in line 60 also goes to LOW state at time $t_4$, and therefore transistor 14 turns OFF. After $\Delta t$ seconds at time $t_4 + \Delta t$ signal 56 from the delay circuit also goes to the LOW state. Therefore, the signal in line 62 goes to LOW state at time $t_4 + \Delta t$ as illustrated in FIG. 3C. As a result, transistor 16 whose gate drive is coupled to line 62 turns OFF $\Delta t$ seconds after transistor 14. As illustrated and explained above, for this cycle of pulse width modulated signal 58, transistor 16 turns ON $\Delta t$ seconds prior to transistor 14, and turns OFF $\Delta t$ seconds later than transistor 14.

At time $t_5$ a new cycle begins and this time transistor 14 turns ON $\Delta t$ seconds before transistor 16, and turns OFF $\Delta t$ seconds later than transistor 16. Thus the switching transistors alternate in each cycle to withstand the entire load current during turn ON and turn OFF.

Signal markings illustrated as a circle in FIGS. 3B and 3C denote points of time when switching losses occur. As shown, switching losses may alternate between the transistor 14 and transistor 16.

Figure 3D:
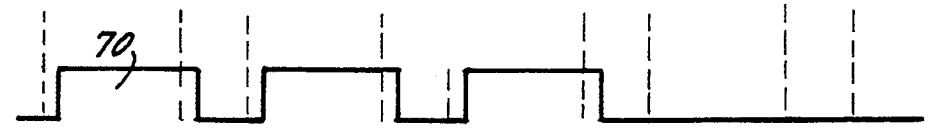

FIG. 3D illustrates the waveform of the load signal in bus 17 of FIG. 1, prior to filtering.

It can be appreciated that the rotation of the switching losses can be used for two or more transistors. For typical MOSFET transistors there is a practical limit of four transistors. The reason for such a practical limit is that the entire load current is sustained by only one transistor during the delay time $\Delta t$. Therefore, the peak current becomes four times the steady state current if four transistors are used. However, most MOSFETs have a peak current rating that is four times higher than continuous operation.

Figure 4:
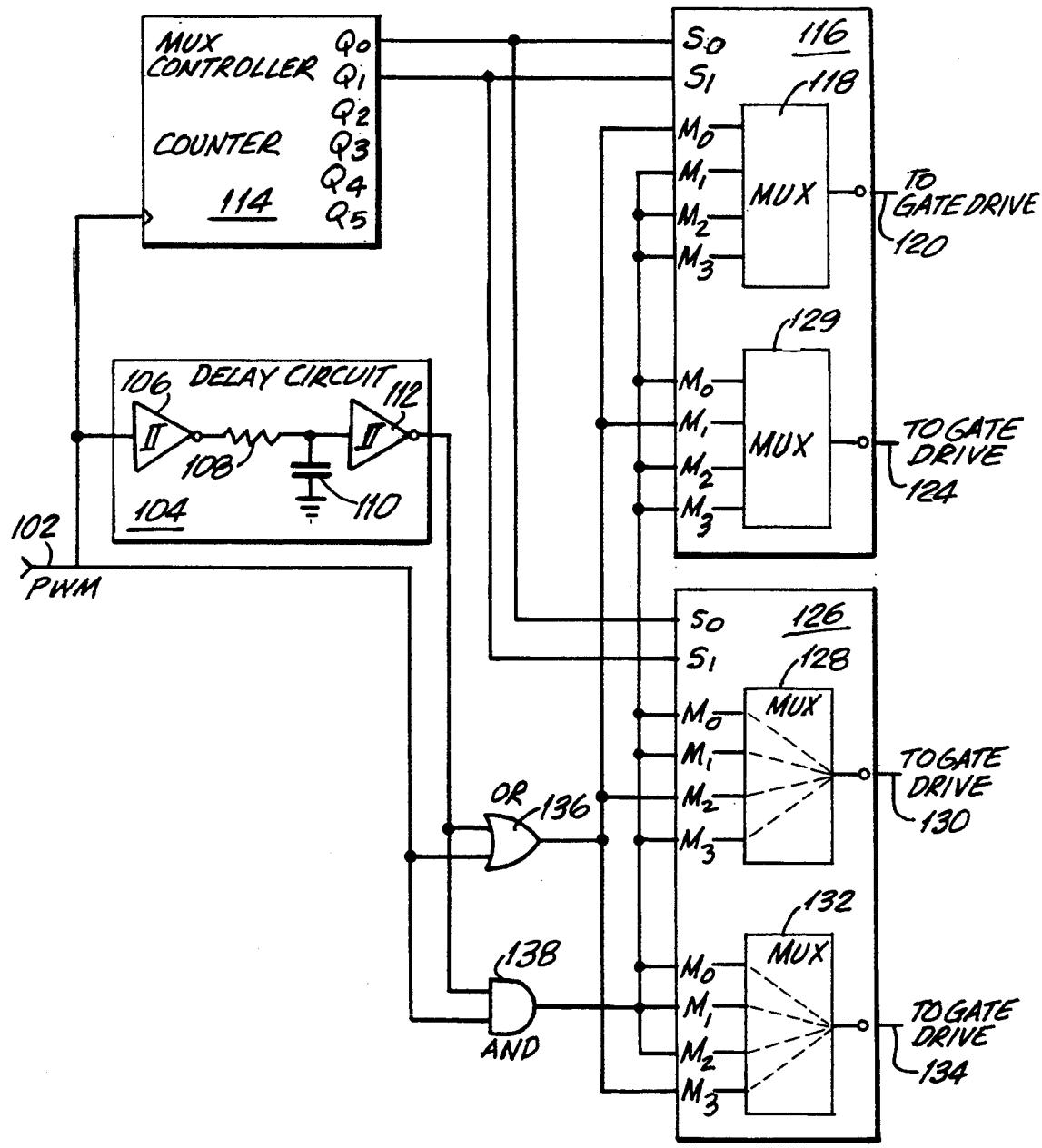
FIG. 4 illustrates another embodiment of alternate selector according to the present invention.

FIG. 4 illustrates a block diagram of another embodiment of alternate selector according to the present invention. FIGS. 5A–5J illustrate the timing diagram associated with the operation of the circuit shown in FIG. 4. The alternate selector illustrated in FIG. 4 may control a plurality of MOSFET transistors connected in parallel.

The PMW pulse train on line 102 is coupled to the input of the alternate selector. The alternate selector according to the embodiment demonstrated in FIG. 4 includes a delay circuit 104, a multiplex controller 114, multiplexers 116 and 126, AND gate 138 and OR gate 136.

Accordingly, the PMW pulse train on line 102 is coupled to the input of delay circuit 104 and the input of counter 114. The PMW pulse train on line 102 is also coupled to a first input of AND gate 138 and to a first input of OR gate 136. The output of the delay circuit is coupled to the second input of AND gate 138 and the second input of OR gate 136.

The delay circuit includes an inverter 106 coupled to the PMW pulse train on line 102. The output of inverter 106 is coupled to another inverter 112 via a resistor-capacitor network 108 and 110.

Multiplexers 116 and 126 provide signals via lines 120, 124, 130, and 134 to gate drives for turning "ON" and "OFF" four MOSFET transistors connected in parallel. Multiplexers 116 and 126 are each dual 4-input multiplexers.

Therefore, multiplexer 116, includes two, four-input multiplexers 118 and 122, and multiplexer 126 includes two, four-input multiplexers 128 and 132. Each multiplexer 118, 122, 128 and 134 has four input ports $M_0$–$M_3$ which are coupled to the outputs of the OR gate 136 and AND gate 138. The input ports of the multiplexers are connected as described hereinafter. Accordingly, input ports $M_1$, $M_2$ and $M_3$ of multiplexer 118 are connected together and to the output of AND gate 138. Input port $M_0$ of multiplexer 118 is coupled to the output of OR gate 136.

Similarly input ports $M_0$, $M_2$ and $M_3$ of multiplexer 122 are connected together and to the output of AND gate 138. Input port $M_1$ of multiplexer 122 is coupled to the output of OR gate 136.

Input ports $M_0$, $M_1$ and $M_3$ of multiplexer 128 are connected together and to the output of AND gate 138. Input port $M_2$ of multiplexer 128 is coupled to the output of OR gate 136. Similarly input ports $M_0$, $M_1$ and $M_2$ of multiplexer 132 are connected together and to the output of AND gate 138. Input port $M_3$ of multiplexer 132 is coupled to the output of OR gate 136. The select ports $S_0$ and $S_1$ of the dual-4 input multiplexers 116 and 126 are coupled to the output ports of a multiplex controller 114.

The multiplex controller is a binary counter with its clock input being coupled to the PMW pulse train on line 102.

Output ports $Q_0$ and $Q_1$ of the counter are coupled to the select ports $S_0$ and $S_1$ of the multiplexer as described before.

The waveforms illustrated in FIGS. 5A–5J explain the operation of the alternate selector. Accordingly, the pulse width modulated signal as shown in FIG. 5A is provided to the input of the alternate selector on line 102. At time $t_1$ a new cycle begins at the start of a pulse. During this time the output of the OR gate as illustrated by FIG. 5C goes to HIGH state and the output of AND gate 138 as illustrated in FIG. 5B is still in the LOW state.

The outputs $Q_0$ and $Q_1$ of counter 114 as illustrated in FIG. 5E and 5F are at LOW state. The input ports $M_0$ of multiplexers 118, 122, 128 and 132 couple the output of AND gate 138 and the output of OR gate 136 to output lines 120, 124, 130 and 134 which in turn are coupled to gate drives of parallel transistors.

Accordingly at time $t_1$ the output of the OR gate is connected to the input port $M_0$ of multiplexer 118. The output of the AND gate is coupled to input port $M_0$ of multiplexers 122, 128 and 132 respectively.

FIG. 5G illustrates the signal at line 120. As shown, at time $t_1$ the output of the OR gate is HIGH and the output of the AND gate is LOW. Therefore signal 162 of FIG. 5G goes HIGH before signals 164, 166 and 168 of FIGS. 5H, 5I and 5J respectively.

At time $t_1 + \Delta t$ as illustrated in FIG. 5B the output of the delay circuit also goes HIGH. Hence the output of the AND gate goes HIGH also, and input ports $M_0$ of multiplexers 122, 128 and 132 become HIGH respectively. Therefore, signals 164, 166 and 168 also go HIGH and turn ON the transistors to which they are connected.

At time $t_2$ the ON period of input pulse signal on line 102 falls to LOW state. The output of the AND gate also goes to LOW state and therefore input ports $M_0$ of multiplexers 122, 128 and 132 become LOW also. Consequently the signals 164, 166 and 168 on lines 124, 130 and 134 fall to LOW state also. At time $t_2 + \Delta t$ the output of the delay circuit also goes to LOW state and therefore signal 162 becomes LOW also. As illustrated and explained above, for one cycle of the pulse width modulation signal on line 102, the transistor driven by signal 162 on line 120 turns ON $\Delta t$ seconds prior to remaining transistors driven by signals 164, 166 and 168 and turns OFF $\Delta t$ seconds later than remaining transistors driven by signals 164, 166 and 168.

Similarly at time $t_3$ a new cycle begins at the start of a pulse. Counter 114 makes a new count and therefore output $Q_0$ of the counter goes HIGH and output $Q_1$ of the counter remains LOW. The select ports $S_0$ and $S_1$ of the dual 4-input multiplexers 116 and 126 couple ports $M_1$ of multiplexers 118, 122, 128 and 132 to output lines 120, 124, 130 and 134 respectively. Therefore for this new cycle, the transistor driven by signal 164 of FIG. 5H on line 124 turns ON $\Delta t$ seconds prior to remaining transistors driven by signals 162, 166 and 168 and turns OFF $\Delta t$ seconds later than remaining transistors driven by the same signals 162, 166 and 168.

Consequently, for each new pulse one transistor turns ON prior to the remaining transistors which are connected in parallel and turns OFF later than the remaining transistors.

It can be appreciated to those skilled in the art that a plurality of transistors may be connected in parallel. During each cycle one transistor dissipates all the switching losses during that cycle and none during the remaining cycles until its turn comes up again. Hence the switching losses may be equally shared among parallel MOSFET transistors in switchmode operation without testing and matching the dynamic parameters of the transistors.

The foregoing description shows only preferred embodiments of the present invention. The invention in its broader aspects therefore is not limited to the specific embodiment herein shown and described but departures may be made therefrom within the scope of the accompanying claims without departing from the principles of the invention and without sacrificing its chief advantage.

I claim:

1. A system for sharing of switching losses of parallel transistors comprising:
   a plurality of switching transistors connected in parallel for providing a current to a load;
   a pulse generator providing pulse width modulated pulse cycles in response to said current each pulse cycle having a pulse signal;
   an alternate selector responsive to said pulse cycles, said alternate selector providing said pulse cycles to said transistors, such that for each pulse cycle a predetermined transistor turns ON substantially prior to the other transistors, dissipating substantially all the turn ON losses, and a predetermined transistor turns OFF substantially later than other transistors, dissipating substantially all the turn OFF losses.

2. The system according to claim 1 wherein same transistor turning ON prior to the other transistors, turns OFF later than other transistors.

3. The system according to claim 2, wherein said transistors are MOSFET transistors.

4. The system according to claim 3, wherein said alternate selector sequentially selects a transistor, at the beginning of each pulse cycle, from said plurality of parallel transistors for dissipating said switching losses.

5. The system according to claim 4, wherein said alternate selector further comprise:
   a time delay circuit providing a delayed version of said pulse cycles;
   a multiplex controller for controlling a multiplexer; and
   said multiplexer responsive to said multiplex controller for coupling a pulse in a pulse cycle to the gate of a selected transistor to be turned ON prior to the other transistors, said multiplexer coupling said delayed version of said pulse in said pulse cycle to the gate of said selected transistor to be turned OFF later than the other transistors.

6. The system according to claim 5, wherein said multiplex controller is a flip-flop responsive to said time delay circuit.

7. The system according to claim 6, wherein said multiplex controller is a binary counter responsive to said pulse width modulated pulses.

8. A system according to claim 1 including an electric motor and providing excitation signals to said electric motor by said system.

9. A system according to claim 1 utilized to provide a current to a load.

10. In a system for sharing of switching losses of MOSFET transistors connected in parallel, said MOSFET transistors being turned ON and OFF in response to a cyclic pulse train, each cycle beginning at a start of a pulse, an alternate selector comprising:
a time delay circuit providing a delayed version of said pulse;
a multiplex controller responsive to said pulse; and
a plurality of multiplexers responsive to said multiplex controller, such that for each cycle a different multiplexer is selected, said selected multiplexer coupling said pulse to a selected transistor to turn ON substantially prior to the other transistors thereby dissipating substantially all the turn ON losses, said selected multiplexer coupling said delayed version of said pulse to said selected transistor to turn OFF substantially later than the other transistors thereby dissipating substantially all the turn OFF losses.

11. The invention according to claim 10 wherein said alternate selector sequentially selects a MOSFET transistor, at the beginning of each pulse cycle, from said plurality of parallel MOSFET transistors for dissipating said switching losses.

12. The invention according to claim 11, wherein said multiplex controller is a binary counter, providing a new count for each pulse in a new cycle.

13. In a system for sharing of switching losses of MOSFET transistors connected in parallel, said MOSFET transistors being turned ON and OFF in response to a cyclic input pulse train, each cycle beginning at a start of an input pulse, an alternate selector comprising:
a logic circuit providing for each said cycle a switching loss pulse having no turn ON delay and having a turn OFF delay, said switching loss pulse driving a selected MOSFET transistor, said logic circuit further providing a plurality of remaining switching pulses having turn ON delay and having no turn OFF delay, said plurality of remaining switching pulses driving remaining MOSFET transistors.

14. The system according to claim 13, further comprising:
a plurality of multiplexers each multiplexer receiving said switching loss pulse and said plurality of remaining switching pulses, each multiplexer having an output adapted to drive one of said plurality of MOSFET transistors; and
a multiplex controller adapted to control said multiplexers for each cycle to select a different input to each multiplexer, such that one of said multiplexers couples said switching loss pulse to said selected MOSFET transistor, and the remaining of said multiplexers couple said remaining switching pulses to said remaining MOSFET transistors.

15. The system according to claim 14, wherein said logic circuit further comprising:
a time delay circuit providing a delayed version of said input pulse;
an OR gate responsive to said input pulse and said delayed version of said input pulse, providing said switching loss pulse; and
an AND gate responsive to said input pulse and said delayed version of said input pulse, providing said remaining switching pulses having turn ON delay and having no turn OFF delay.

16. A method for sharing of switching losses of parallel switching transistors comprising the steps of:
providing a current to a load via said plurality of switching transistors connected in parallel;
providing pulse cycles each having a pulse in response to said current to turn ON and OFF said transistors;
substantially turning ON a predetermined transistor among said plurality of transistors prior to other transistors in each pulse cycle thereby dissipating substantially all the turn ON losses in said pulse cycle; and
substantially turning OFF a predetermined transistor among said plurality of transistors later than other transistors in each pulse cycle, thereby dissipating all the turn OFF losses in said pulse cycle.

17. The method according to claim 16 wherein said step of turning OFF comprise turning OFF the same transistor that was turned ON during said step of turning ON.

18. The method according to claim 17, wherein said transistors are MOSFET transistors.

19. The method according to claim 18, further comprising the step of sequentially repeating the steps of turning ON and turning OFF by selecting a different MOSFET transistor at the beginning of each pulse cycle, from said plurality of parallel MOSFET transistors for dissipating said switching losses.

20. The method according to claim 19, further comprising the steps of:
generating a delayed version of said pulse cycles;
coupling a pulse at the beginning of a pulse cycle to a selected transistor to be turned ON substantially prior to the other transistors; and
coupling a delayed version of said pulse to said selected transistor to be turned OFF substantially later than the other transistors.

* * * * *